United States Patent [19]

Loder et al.

[11] Patent Number: 5,716,229
[45] Date of Patent: Feb. 10, 1998

[54] HIGH SPEED CONNECTOR

[75] Inventors: Harry Alan Loder, Austin; Duane Thomas Smith, Cedar Park, both of Tex.

[73] Assignee: Minnesota Mining and Manufacturing Company, St. Paul, Minn.

[21] Appl. No.: 577,898

[22] Filed: Dec. 22, 1995

[51] Int. Cl.$^6$ ...................................................... H01R 9/07
[52] U.S. Cl. ...................... 439/493; 439/495; 439/497
[58] Field of Search ............................ 439/493, 67, 77, 439/495, 289, 610, 497

[56] References Cited

U.S. PATENT DOCUMENTS

| | | | |
|---|---|---|---|
| 3,436,715 | 4/1969 | Matthews | 439/77 |
| 3,805,218 | 4/1974 | Voida | 439/610 |
| 4,536,045 | 8/1985 | Reichardt et al. | 339/14 |
| 4,645,280 | 2/1987 | Gordon et al. | 339/17 |
| 4,690,510 | 9/1987 | Takamatsu et al. | 350/334 |
| 4,808,112 | 2/1989 | Wood et al. | 439/66 |
| 4,815,990 | 3/1989 | Ristedt et al. | 439/496 |
| 5,049,087 | 9/1991 | Chung et al. | 439/259 |
| 5,049,090 | 9/1991 | Johnson | 439/493 |
| 5,051,366 | 9/1991 | Anderson et al. | 436/67 |
| 5,093,985 | 3/1992 | Houldsworth et al. | 29/830 |
| 5,186,638 | 2/1993 | Pusch | 439/493 |
| 5,213,512 | 5/1993 | Campbell et al. | 439/67 |
| 5,297,968 | 3/1994 | Johnson et al. | 439/67 |
| 5,378,161 | 1/1995 | Loder | 439/77 |

FOREIGN PATENT DOCUMENTS 2218580  11/1989  United Kingdom ............ H01R 11/01

*Primary Examiner*—Gary F. Paumen
*Assistant Examiner*—Tho D. Ta
*Attorney, Agent, or Firm*—Gary L. Griswold; Walter N. Kirn; Matthew B. McNutt

[57] ABSTRACT

A high speed connector allows the conductors of a cable to be connected directly to the circuit traces of a printed circuit board by providing a plug having an end where the conductors terminate and a housing for the plug which cooperatively urges the conductors toward the circuit board.

5 Claims, 10 Drawing Sheets

5,716,229

HIGH SPEED CONNECTOR

FIELD OF THE INVENTION

The present invention relates generally to electrical connectors and particularly to connectors for electrically connecting the conductors of a cable to the circuit traces of a printed circuit board.

BACKGROUND OF THE INVENTION

Among the many electrical connectors available today are mass terminable insulation displacement connectors such as those used to terminate ribbon cable, single ended connectors such as BNC (British Naval) connectors commonly used to terminate coaxial cables, and flat conductor flat ribbon cable connectors, such as zero-insertion-force connectors. These prior connection solutions generally fail to satisfy the expanding need for connector size reduction, increased density and improved electrical performance. There is no single connector that will satisfy all the above mentioned needs.

New cables recently available in the market, such as those described in U.S. Pat. No. 5,306,869, offer performance features which far outpace all planar cables previously available. The electrical performance of these new cables is so good that the inferior electrical performance of the state of the art connectors are not able to take full advantage of the improved cable's effectiveness. Thus cable assemblies produced using these cables are limited in performance by the connectors available.

The primary problem with most connectors is that the signal is distorted as it passes along the electrical path provided by the connectors. This electrical path is generally dictated by a combination of electrical and mechanical requirements such as current rating, cable pitch, mounting configuration, and termination style. In all existing connectors it has been necessary to reach a compromise between a connector's electrical performance and the physical space available to mount the connector for a given application. Because the electrical performance of the connector must be compromised, planar connectors are plagued by impedance discontinuities, crosstalk problems, and density limitations. In order to minimize these problems, connectors designs have resorted to elaborate mechanical solutions resulting in connectors which are complicated, expensive, and bulky. The above-mentioned connector problems are presently being compounded by the ever increasing demand for higher speed electrical performance. Connectors which once functioned adequately at slower clock speeds are of little value today.

SUMMARY OF THE INVENTION

The present invention accomplishes higher speed service in terminating a cable at a printed circuit board by providing a housing for mounting on a circuit board in proximity to a circuit trace, a plug adapted for insertion into the housing and retention by the housing adjacent the circuit board, the plug having an end proximate the circuit board when the plug is inserted in the housing and including means for retaining the cable with the conductor exposed at the plug end and latching means cooperating with the housing for retaining the plug within the housing and urging the conductor toward the circuit board. The means for exposing the conductor at the end of the plug may be forming the exposed conductor around a rounded end of the plug or encapsulating the cable end in epoxy and grinding the end surface to expose the bare end of the conductor.

BRIEF DESCRIPTION OF THE DRAWINGS

The present invention will be described with respect to the accompanying drawings, wherein like numbers refer to like parts in the several views, and wherein.

DESCRIPTION OF THE PREFERRED EMBODIMENT

Figure 1:
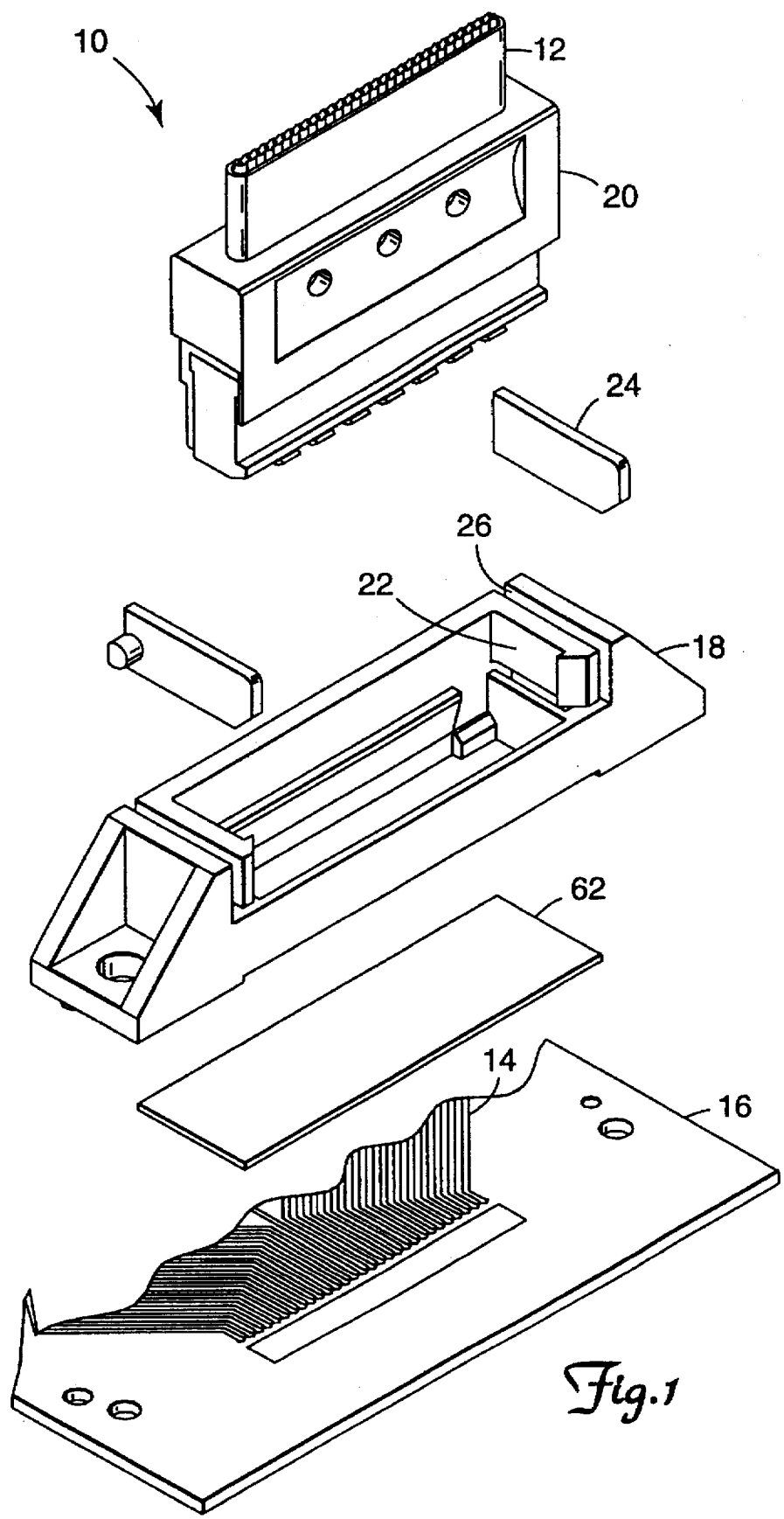
FIG. 1 is an exploded perspective view of a cable connector according to one embodiment of the present invention.

FIG. 1 illustrates the components of a connector, generally indicated as 10, according to the present invention. The connector 10 is adapted to connect the conductors of a cable 12 to the circuit traces 14 of a printed circuit board 16, and includes a housing 18 which attaches to the circuit board 16 and a plug 20 which terminates the cable 12 and is designed to be retained by the housing 18. The housing includes resilient retention latches 22 which grasp the plug 20. Latch locks 24 may be provided which slide into slots 26 adjacent the latches 22 to prevent the latches 22 from flexing and releasing the plug 20.

Figure 2:
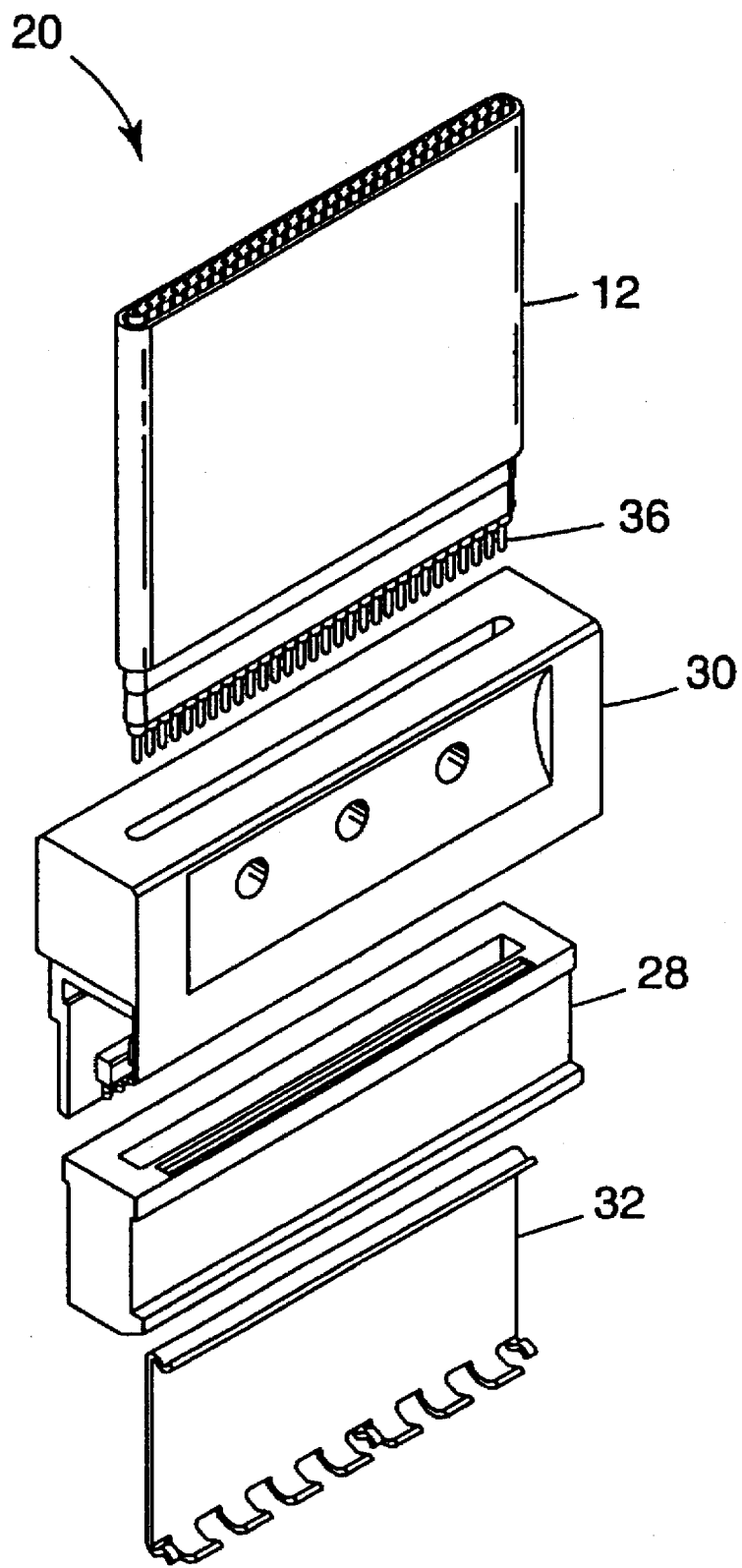
FIG. 2 is an exploded perspective view of a plug portion of the connector of FIG. 1.

FIG. 2 illustrates the components of the plug 20, which include a wire former 28, an overmolded grip and cable strain relief 30, and an optional ground bus 32 which may be used to terminate the cable's shield, if so provided.

Figure 3:
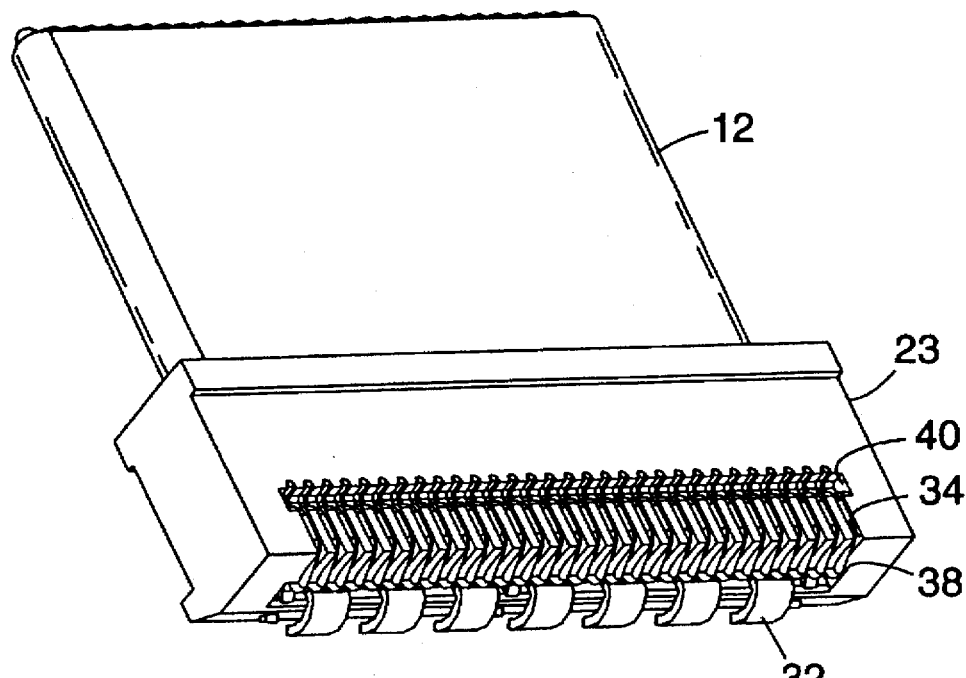
FIG. 3 is a perspective view of a portion of the plug of FIG. 2.
Figure 4:
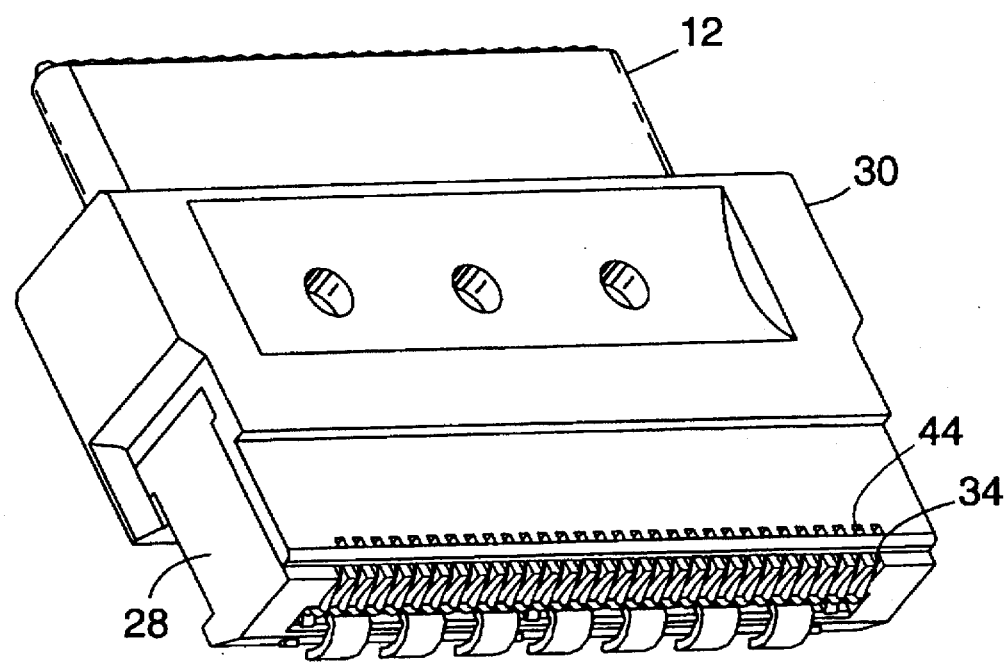
FIG. 4 is a perspective view of the complete plug of FIG. 2.

FIG. 3 shows the end of the wire former 28 portion of the plug 20 which includes a series of conductor alignment grooves 34. Prior to assembly of the cable 12 to the wire former 28, the insulation of the cable 12 is stripped for a predetermined distance to expose the bare conductors 36. These bare ends of the conductors 36 are bent around a relatively sharp edge 38 at the plug end (FIGS. 5–8) to form contacting surfaces. The ends of the conductors 36 are pushed into a recess 40 formed in the side of the wire former 28 for temporary retention of the conductors 36.

Once the cable 12 and its conductors 36 are secured to the wire former 28, the strain relief 30 is over-molded on the wire former 28 to permanently retain the cable 12. Alternatively, the strain relief 30 may be made in two halves and attached to the wire former by fasteners or other means. The strain relief 30 may be of metal if shielding is desired.

Figure 5:
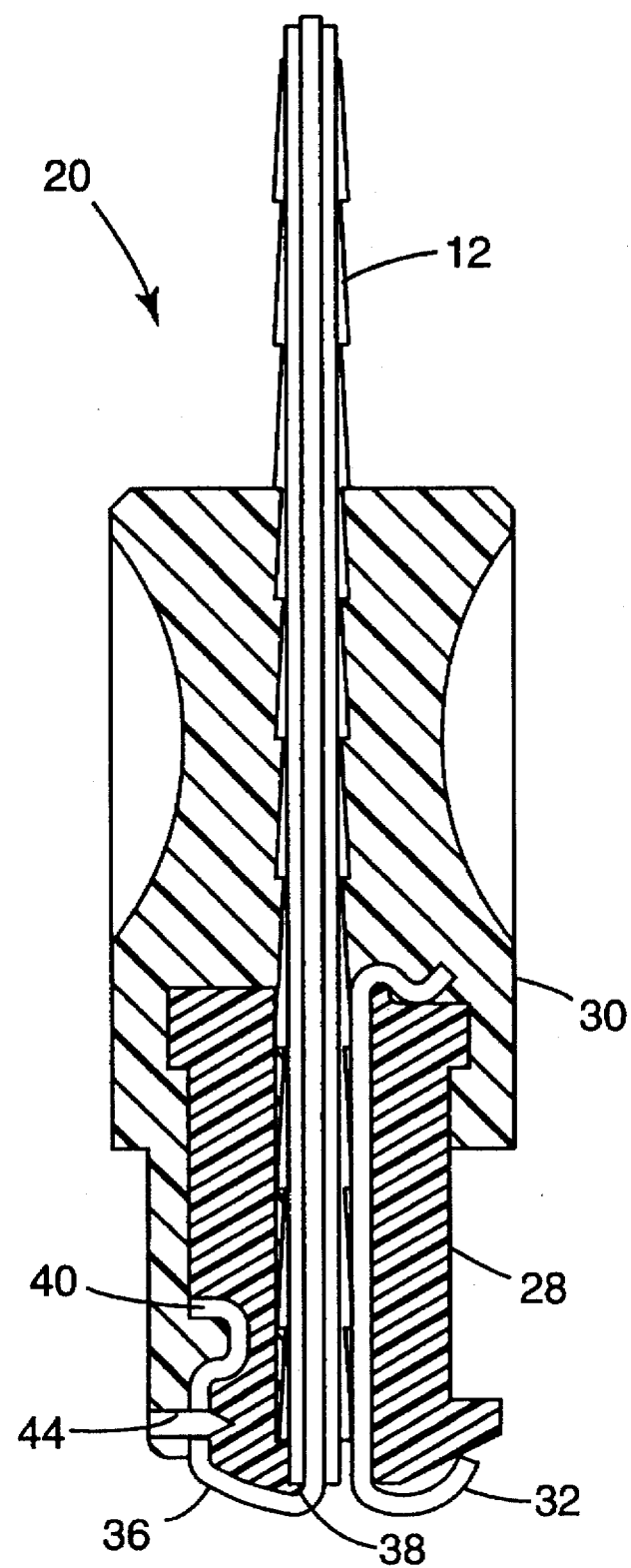
FIG. 5 is a cross-sectional side view of the plug of FIG. 2.

The strain relief 30 is formed with a series of openings 44 which allow the conductor ends 36 to be cut close to the point where they wrap around the end of the wire former 28. This is best seen in FIG. 5 and improves the electrical performance of the plug 20, and connector 10 in general, by eliminating the long tail of the conductors 36 which can act as an antenna to transmit radio frequency signals under certain conditions.

Figure 6:
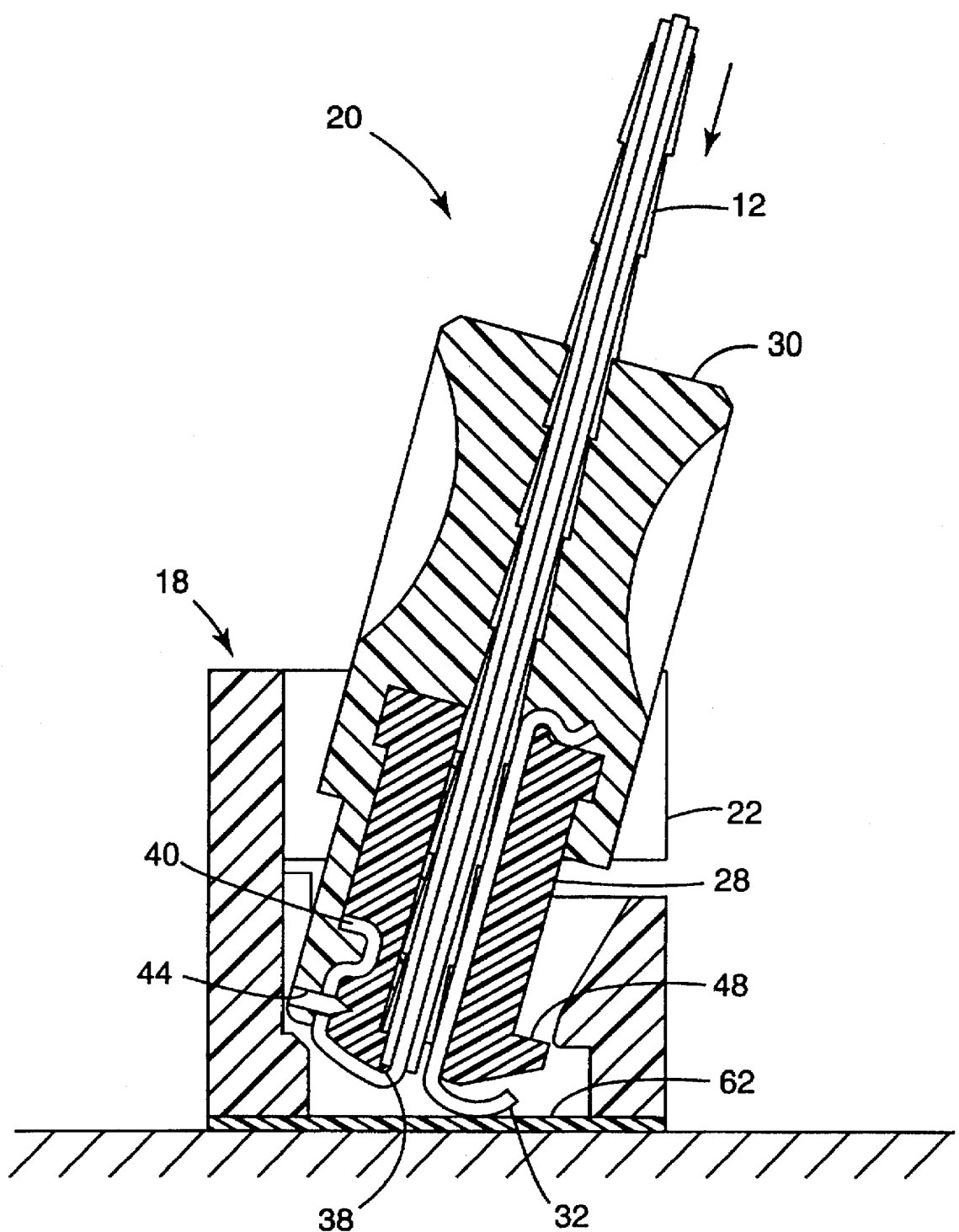
FIGS. 6, 7 and 8 are cross-sectional side views of the plug of FIG. 2 and a housing for retaining the plug, with the plug and housing in progressive stages of assembly to each other.
Figure 7:
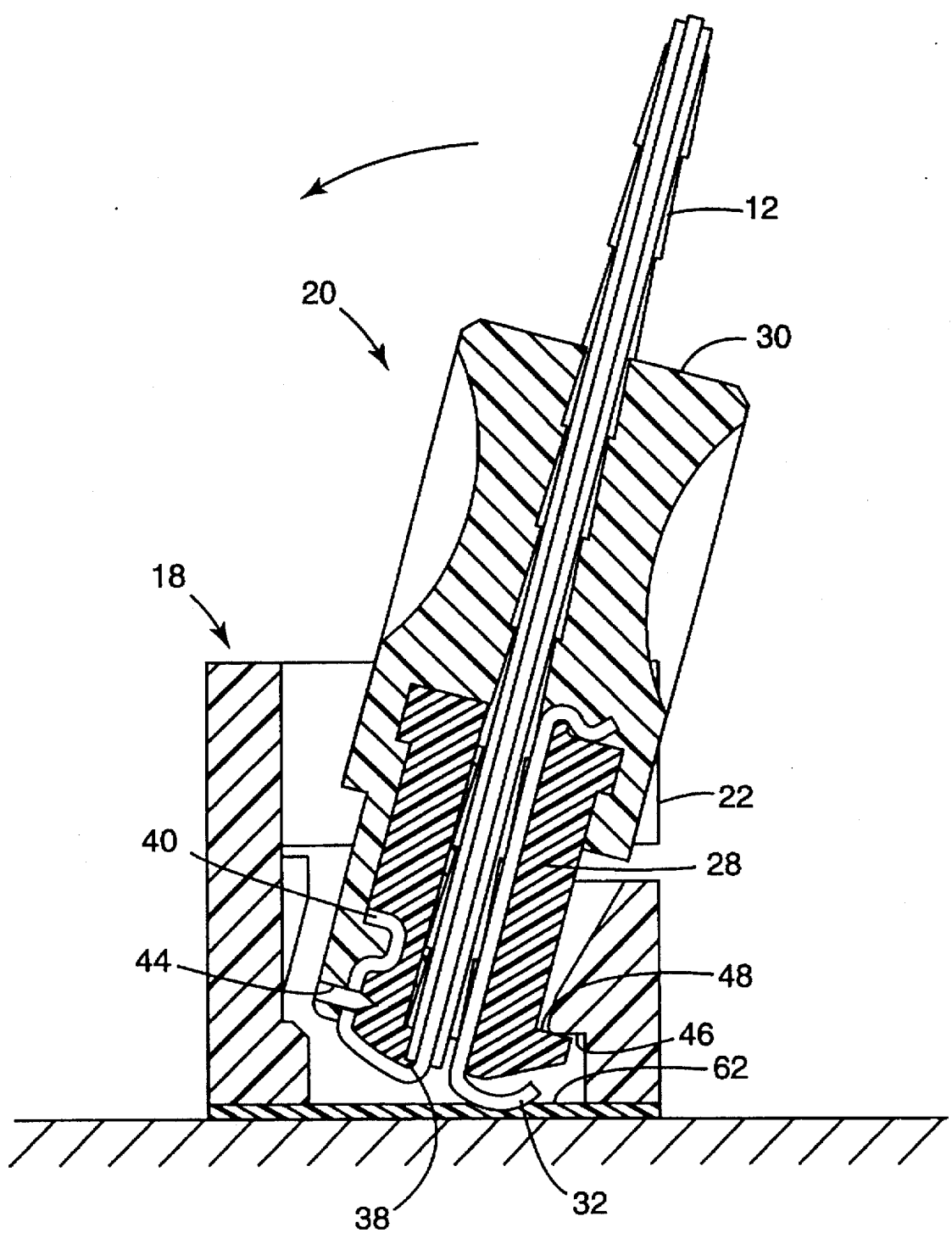
Figure 8:
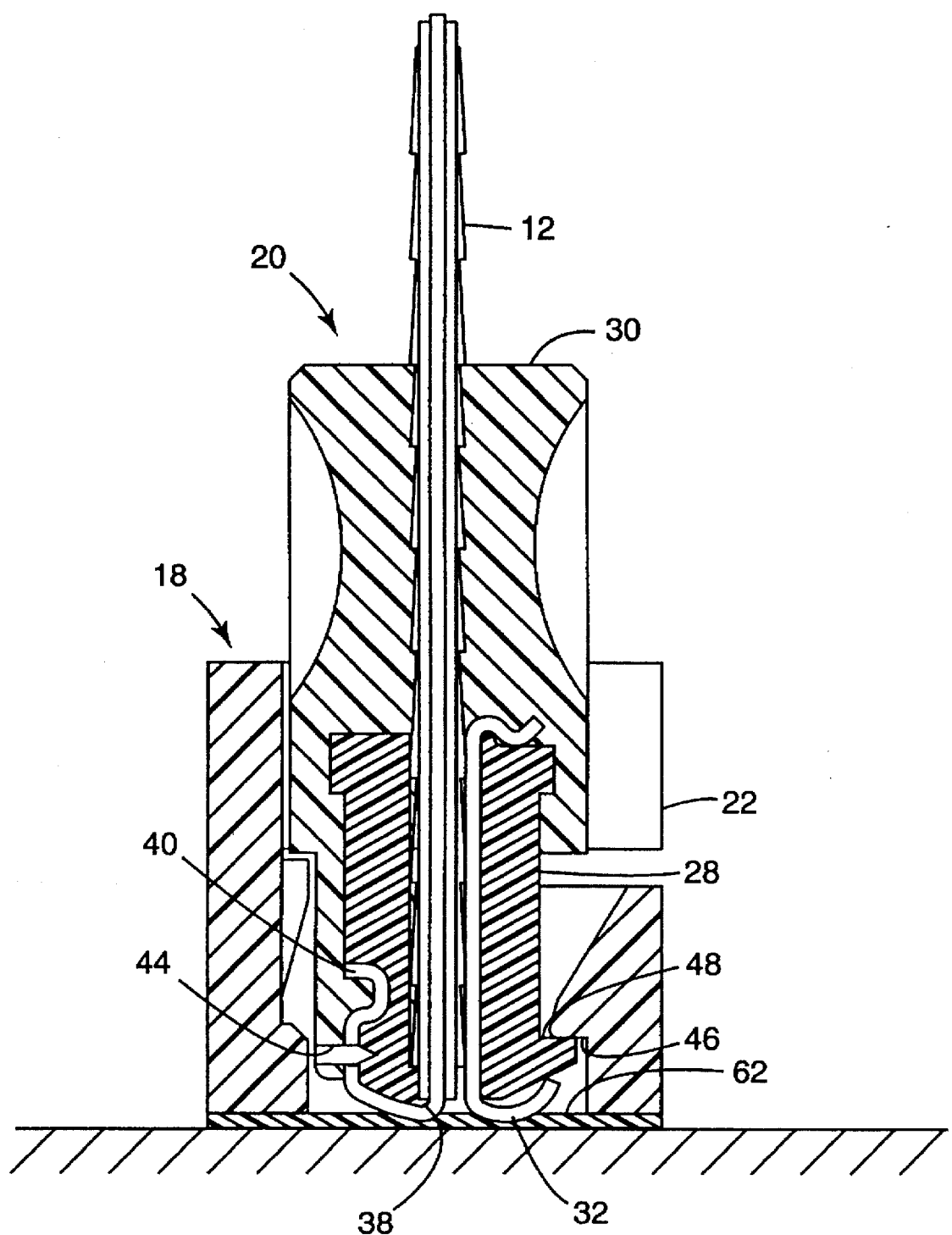
Figure 9:
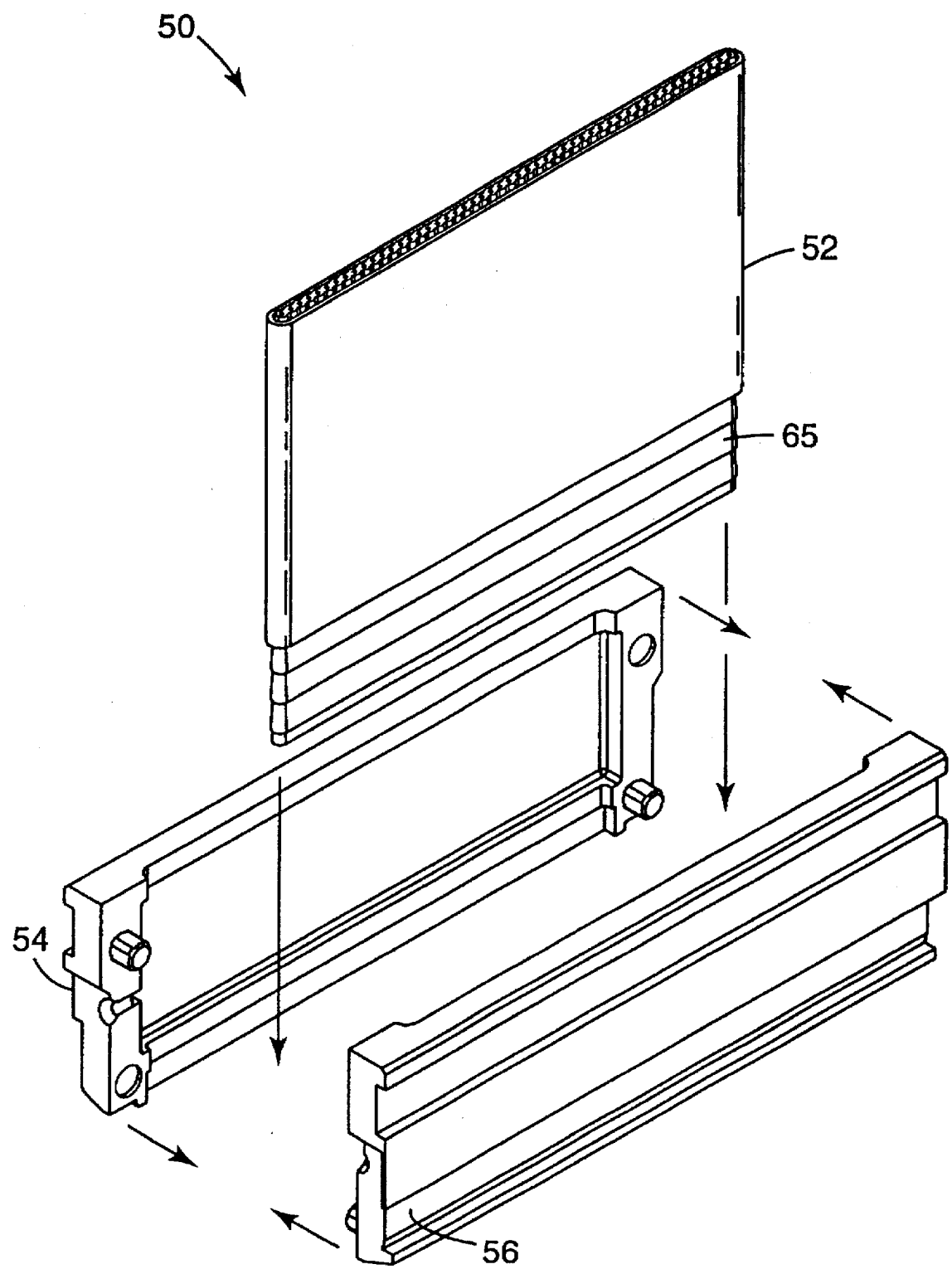
FIG. 9 is an exploded perspective view of a plug portion of a connector according to an alternate embodiment of the present invention.

FIGS. 6–8 illustrates the mechanism by which the plug 20 is retained in the housing 18. The housing is provided with a lateral projection 46 and the two latches 22 described earlier. The plug 20 is provided with a complimentary lateral projection 48 and has corners which are adapted to be engaged by the housing latches 22. To seat the plug 20 in the housing 18, the plug is tilted to engage the two projections 46 and 48, and then rotated toward the vertical until the latches 22 engage the corners of the plug 20. The relative distances of the projections 46 and 48 from the circuit board 16 and the end of the plug 20, respectively, are chosen so that a downward force urging the conductors 36 toward the circuit board 16 is present when the plug 20 is latched in the housing 18. It will be seen that the optional ground bus 32 is likewise forced into contact with the circuit board 16.

Figure 10:
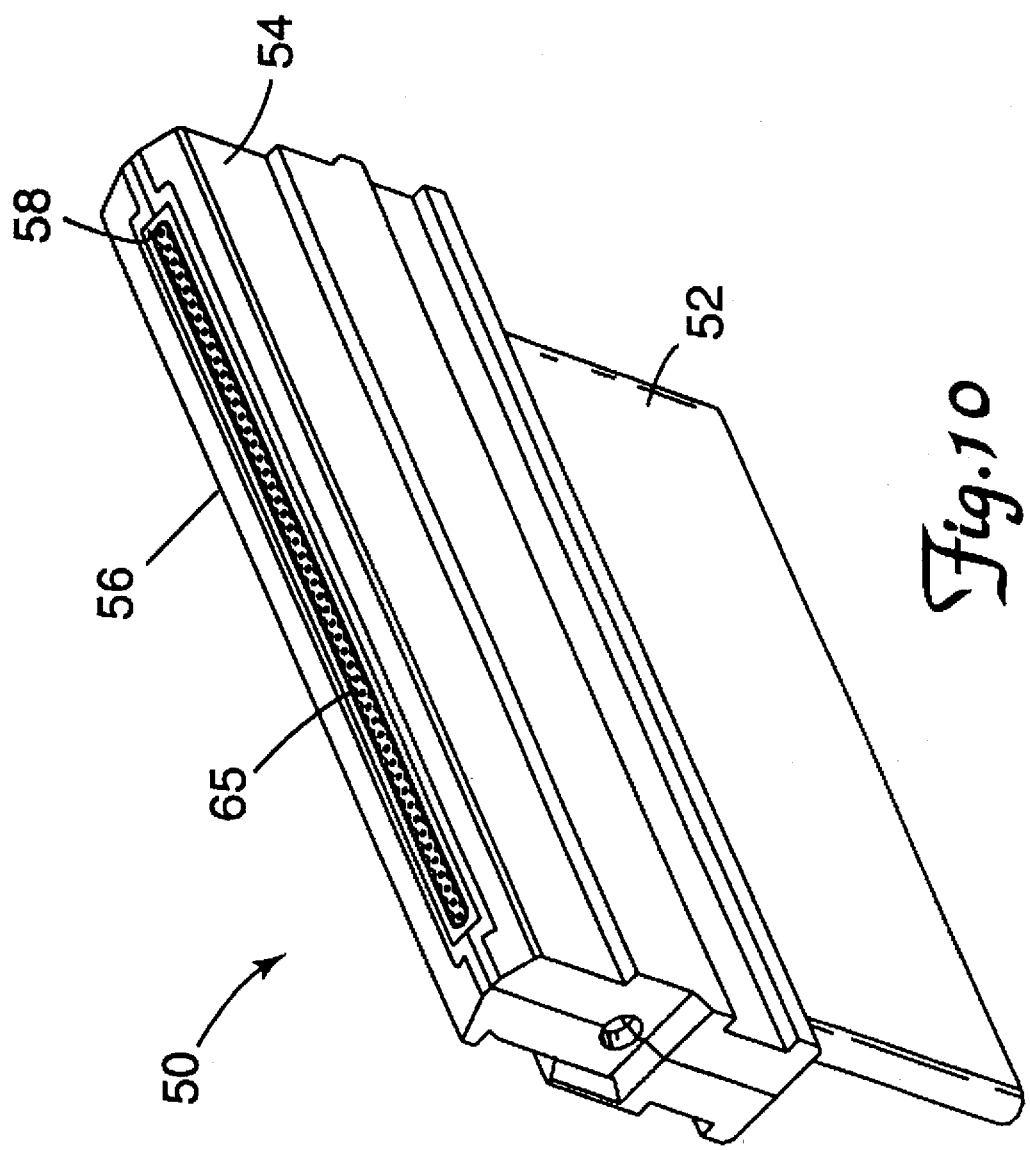
FIG. 10 is a perspective view of the plug of FIG. 9.
Figure 11:
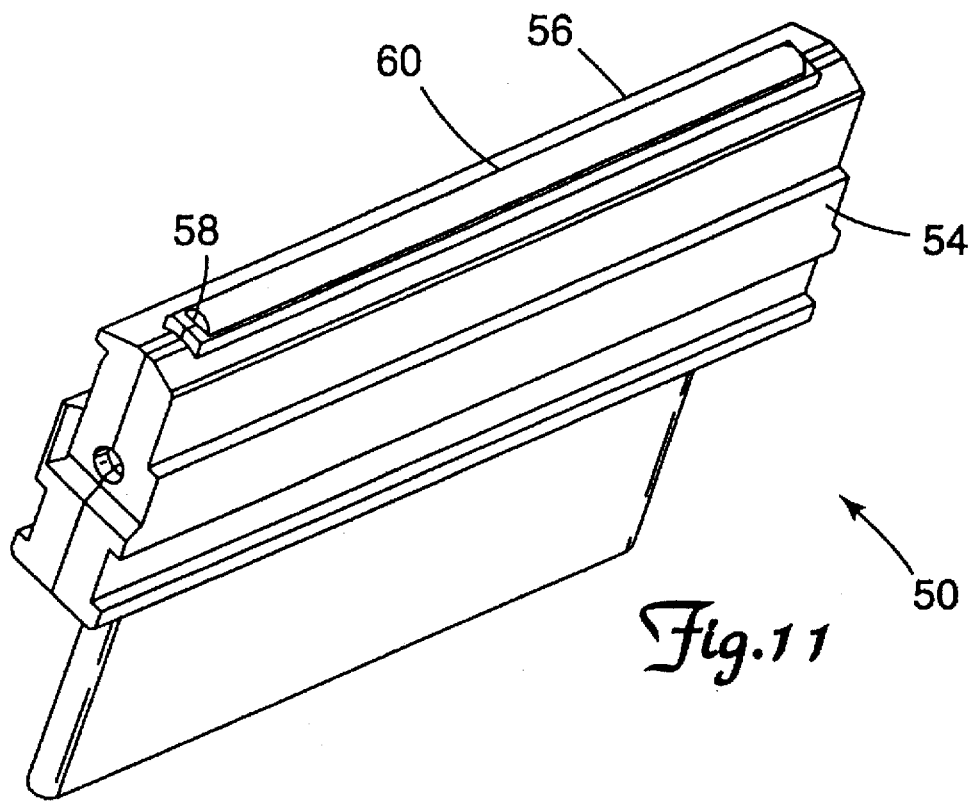
FIG. 11 is a perspective view of the plug of FIG. 9 in an intermediate stage of assembly.
Figure 12:
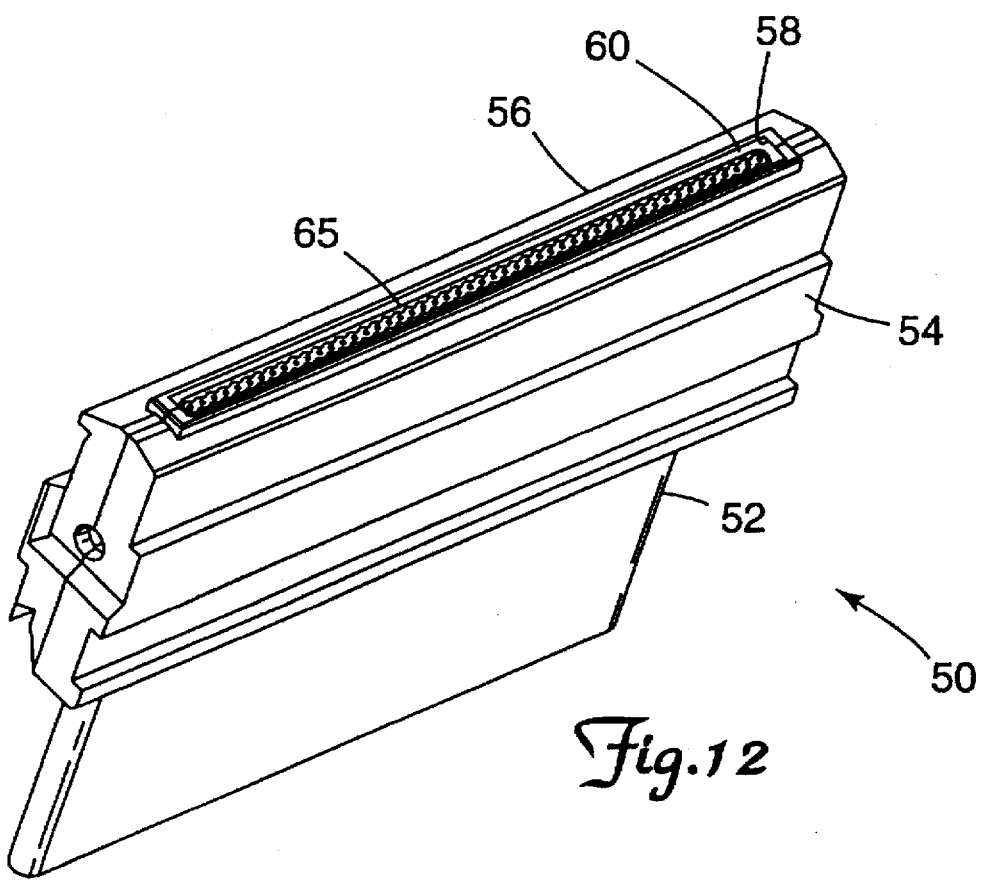
FIG. 12 is a perspective view of the plug of FIG. 9 after assembly is completed.

FIGS. 9–12 illustrate an alternate embodiment of a plug 50 wherein the conductors are cut off and their ends used for direct connection to the circuit board 16 without bending. A cable 52 is inserted between two clamshell halves 54 and 56 which are connected by fasteners, snap latches or adhesive. As best seen in FIG. 10, the shell halves 54 and 56 produce a well 58 in which the cable 52 end is located. The cable 52 is positioned so that its end protrudes slightly beyond the end of the plug 50. The well 58 and the clamshell halves 54 and 56 are filled with an encapsulating agent 60 such as epoxy, and then the end is ground and polished to produce a surface having the ends of the conductors exposed in a matrix of epoxy. Note in FIG. 1 that an optional sheet of so-called "z-axis" conductive elastomer 62 may be positioned between the circuit board 16 and the conductors 36. This material conducts electricity only in the direction normal to its major surfaces, and is compliant to seal and intimately engage the conductors 36 of the cable 12. This material would be useful with either of the embodiments illustrated, but would be particularly useful in connection with the embodiment of FIGS. 9–12 since the ends of the conductors are embedded in encapsulating material and so would benefit from a material that could conform to the end surface of the plug 50. The z-axis elastomer 62 could be replaced by mechanical contact means such as planar spring members or other such devices commonly used in the electronics industry to correct nonplanarity concerns.

Thus there has been described a connector which offers high density, high signal integrity and compactness in a single package. The connector should afford cable terminations of unequaled electrical performance. High densities of 0.5 mm or less should be obtainable. Because the connector does not require large bulky ground planes, latches or shields, the physical size may be kept small.

Although the invention has been described with respect to only two embodiments, many additions and modifications are possible. For example, the cable 52 of FIGS. 9–12 may include a metal shield 65 surrounding the cable, in which case the shield would be encapsulated and exposed like the conductors to contact a ground pad on the printed circuit board. In this manner, the cable can be shielded and its impedance controlled all the way to the cable's connection to the circuit board. Also, it will probably be preferable to plate the exposed conductors of either embodiment with a corrosion-resistant material such as nickel or gold.

The invention claimed is:

1. A connector for connecting a cable having at least one conductor to a conductive trace of a circuit board, the connector comprising:

a housing for mounting on the circuit board in proximity to the circuit trace;

a plug adapted for insertion into said housing and retention by said housing adjacent the circuit board, said plug having an end proximate the circuit board when said plug is inserted in said housing and including:

means for retaining the cable permanently within the plug with an end of the conductor exposed at said plug end; and means cooperating with said housing for retaining said plug within said housing and urging said conductor toward the circuit board;

wherein said cable includes an electrical shield surrounding the conductor and extending to said plug end such that an end of said electrical shield and said conductor end are coplanar with said plug end.

2. A connector according to claim 1 wherein said means for retaining said plug includes a projection on said housing and a cooperating projection on said plug, both projections operating when engaged to maintain said plug in desired proximity to said circuit board when said plug is completely inserted in said housing.

3. A connector according to claim 1 wherein insertion of said plug into said housing wipes said conductor against said circuit board.

4. A connector according to claim 1 wherein the conductor is surrounded by an encapsulant with its end exposed.

5. A connector according to claim 4 wherein said encapsulant is epoxy.

\* \* \* \* \*